United States Patent [19]
Berg

[11] Patent Number: 5,384,230
[45] Date of Patent: Jan. 24, 1995

[54] PROCESS FOR FABRICATING PRINTED CIRCUIT BOARDS

[76] Inventor: N. Edward Berg, 43 Smith Rd., Bedford, N.H. 03110

[21] Appl. No.: 845,266

[22] Filed: Mar. 2, 1992

[51] Int. Cl.$^6$ ............................................. G03F 7/00
[52] U.S. Cl. ................................. 430/313; 430/273; 430/314; 430/315; 430/318; 430/324; 430/394; 430/396; 430/503
[58] Field of Search ............... 430/273, 260, 261, 503, 430/394, 313, 314, 315, 318, 324, 396

[56] References Cited

U.S. PATENT DOCUMENTS

| | | | |
|---|---|---|---|
| 4,168,980 | 9/1979 | La Rossa | 430/353 |
| 4,341,856 | 7/1982 | Toyama et al. | 430/503 |
| 4,373,018 | 2/1983 | Reichmanis et al. | 430/503 |
| 4,515,877 | 5/1985 | Barzynski et al. | 430/5 |
| 4,666,818 | 5/1987 | Lake et al. | 430/261 |
| 5,015,553 | 5/1991 | Grandmont et al. | 430/273 |

*Primary Examiner*—Janis L. Dote
*Attorney, Agent, or Firm*—Hayes, Soloway, Hennessey, Grossman & Hage

[57] ABSTRACT

A process for forming interconnection lines on a printed circuit board is described. The surface of a circuit board substrate is covered with a photoresist layer, and the photoresist layer in turn is covered with a halide emulsion layer. The emulsion layer is then exposed to a predetermined pattern of white light, and the image developed. The board is then exposed to UV light through the imaged emulsion layer which acts as a pattern masking selected portions of the photoresist mask. The emulsion layer is then stripped and the photoresist processed in conventional manner.

7 Claims, 2 Drawing Sheets

PROCESS FOR FABRICATING PRINTED CIRCUIT BOARDS

FIELD OF THE INVENTION

The invention relates generally to the manufacture of printed wiring boards for electrical components and more particularly to photoprocessing techniques for manufacturing printed wiring boards.

BACKGROUND OF THE INVENTION

The ongoing integration and miniaturization of components for electronic circuitry has become a growing challenge to the limits of printed wiring board technology over the last twenty years. Printed circuit boards or printed wiring boards (PWB) as they are more commonly termed, play several key roles. First, the electrical components, such as specially packaged integrated circuits, resistors, etc., are mounted or carried on the surface of the flat usually sturdy card-like board. Thus, the PWB serves as a support for the components. Secondly, using chemically etched or plated conductor patterns on the surface of the board, the PWB forms the desired electrical interconnections between the components. In addition, the PWB can include a metal area serving as a heat sink.

Conductor patterns typically are formed by photoetching a copper foil clad epoxy fiberglass substrate. A photoresist layer is applied to the copper foil and patterned by exposure to ultraviolet (UV) light projected through a mask, often referred to as "artwork", e.g., to a positive art work image of the circuit pathways and contacts. Those areas exposed to the light are altered and are removed by treatment with a solvent for the resist, leaving areas of copper, e.g., in the desired conductor pattern, underneath the protective barrier of the remaining photoresist. The exposed copper is etched away and the remaining photoresist is then chemically removed to expose the resulting conductor pattern. Alternatively, the photoresist can be patterned to form channels for electroless plating of conductor patterns. There are, of course, many variations on this procedure, but all of them require photo-patterning of the resist layer.

Increased use of integrated circuits, and surface mount technology (SMT) has accelerated the densification of electronic circuitry. Surface mount devices (SMD) are applied directly to the surface of the PWB and soldered using vapor phase, infra-red (IR) or other mass soldering techniques. SMT is revolutionizing the electronic manufacturing industry by reducing assembly cost by about 50%, increasing component density by over 40% and enhancing reliability. The array of terminals on SMD's has a higher density or finer pitch then those on conventional components. As each terminal still has to be properly electrically connected to the respective conductor on the board, registration of SMD's requires high resolution for the PWB conductor lines. Indeed, SMD circuitry has become so dense that double-sided boards cannot accommodate all of the needed electrical connections. Thus, multilayer PWB's have become the focus of attention and several competing technologies are evolving. Those techniques which rely on stacks or layers of conductor patterns have interlayer registration requirements in additional to the exacting line width and spacing of a conductor pattern in a given layer. Manufacturing very fine lines on the order of 3 to 5 mils in registration over four or more layers deep is very difficult.

To take fullest possible advantage of the benefits offered by the emerging SMT, new fabrication processes must be developed in the manufacture of substrates and boards. In the past, one of the problem areas in fabrication of PWB's has been the generation and use of artwork masters for patterning the photoresist layers. Using photographic film or glass plates poses inherent difficulties in stability, registration, transport and storage.

In order to eliminate artwork masters the industry has fostered the development of UV laser plotters. These machines pattern the UV sensitive resist directly without artwork. Conductor patterns are designed using computer-assisted design (CAD) which digitizes the coordinates and dimensions of all of the paths and converts them to control signals for a UV laser x-y plotter. However UV laser plotters have a number of limitations, particularly when used for fine line, high density work. Principal among these is the fact that UV sensitive resists are relatively insensitive materials, requiring high levels of exposure energy. As a result, line edge resolution is limited. In order to achieve high plot speeds, these systems operate in a raster scan mode. Raster scanning produces considerable edge irregularities which are particularly apparent in plotting angled lines. Limitations in accuracy and minimum line width are characteristic of existing raster plotting systems. Another problem of current raster plotting systems is the short life expectancy of the laser source. A further problem with direct-from-CAD UV plotting of the photoprocessible layer is that such systems do not permit inspection before polymerization. If an error is made in the plot, the mistake is indelibly embedded in the UV sensitive layer. In the case of a resist, the board may be salvaged only by removing the entire resist layer and starting over after cleaning and baking the board free of moisture a second time. In the case of a UV plotted solder mask, a glitch in the pattern may result in the entire panel being discarded. Also, UV laser plotters are very expensive, and are relatively slow.

The foregoing discussion of the prior art is taken largely from Lake et al, U.S. Pat. No. 4,666,818 who propose a method for fabricating a printed circuit board utilizing two photo-reactive coatings. According to Lake et al a photo-processable ultraviolet sensitive layer is overlayed with a thin, unexposed, and undeveloped (silver halide) photographic film. A CAD system, containing within it the desired pattern layout for the interconnection lines, drives a white light X-Y plotter to expose the silver halide film on the board in the desired pattern, without effecting the underlying ultraviolet sensitive layer. The film is then developed and used as an in-situ mask for patterning the ultraviolet layer during an exposure of the board to ultraviolet light. The silver halide photographic film is not further affected by the exposure of the board to ultraviolet light. After the ultraviolet exposure, the silver halide photographic film is peeled off, to expose the resist, and the resist-coated board is processed further according to conventional methods.

Although capable of producing somewhat respectable interconnection line resolution and definition, the teachings of this patent result in serious drawbacks. First, even though Lake et al. teaches use of a white light x-y plotter and not a UV laser, all of the drawbacks associated with the use of a UV laser, e.g. speed, cost, etc., are presented by Lake et al. Moreover, the presence of the photographic film substrate introduces optical problems which results in reduced interconnection line definition and resolution due to white light diffusion through the film.

OBJECTS OF THE INVENTION

Accordingly, it is a general object of the present invention to overcome the aforementioned and other disadvantages of the prior art. A more specific object of the present invention is to provide a process for forming printed circuit interconnection lines of extremely fine definition and high resolution. Yet another object of the present invention is to provide such a process that does not require the use of highly complex machinery and one which is relatively inexpensive to implement, and is readily adapted for use in mass-producing printed circuit boards.

SUMMARY OF THE INVENTION

The present invention provides a system which overcomes the aforesaid and other disadvantages of the prior art by coating a circuit board substrate with a conventional photoresist layer, and covering the photoresist layer with a formed in situ light sensitive silver halide emulsion layer. The silver halide emulsion layer is then exposed to light of a first wavelength, such as white light through a mask to a predetermined patterned image by a conventional exposure lamp such as a white light flash tube or the like. Alternatively, the silver halide emulsion may be exposed by a computer driven array scanner, a raster, or the like. The exposed emulsion layer is then developed, whereby to form a patterned image overlaying the photoresist layer. Due to the high definition characteristics of the halide emulsion layer the resulting patterned image forms a high definition mask in direct contact with the resist. The resulting patterned image coated board is then exposed to light of a second wavelength such as, ultraviolet light. The halide emulsion layer is then stripped, leaving the patterned exposed photoresist layer coated board ready for further processing in accordance with conventional additive processes or in the case of a metallized or foil clad circuit board substrate subtractive processes.

BRIEF DESCRIPTION OF THE DRAWINGS

Other features of the present invention will become apparent as the following discussion proceeds and upon reference to the enclosed drawings, wherein like numbers depict like parts, and wherein:.

While the present invention will hereinafter be described in connection with preferred embodiments and methods, it will be understood that it is not intended to limit the invention to these embodiments. On the contrary, it is intended to cover all alternatives, modifications, and equivalents as may be included within the spirit and scope of the invention as defined only by the appended claims.

DESCRIPTION OF THE PREFERRED EMBODIMENT

Figure 1:
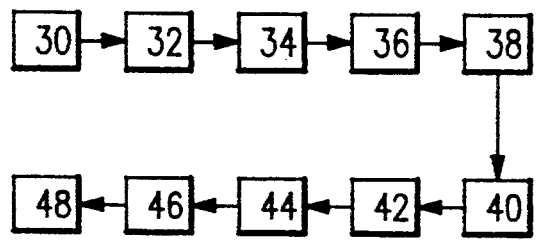
FIG. 1 is a block flow diagram illustrating one process for producing a printed circuit board in accordance with the present invention.
Figure 2:
FIGS. 2 to 10 are diagramatic cross-sectional views of a printed circuit board at various stages of formation in accordance with the process of the present invention.

Referring now to FIGS. 1 and 2 of the drawings, conductive layer 3 such as a copper foil cladding or vapor deposited metal layer is disposed at metallizing station 30 on one surface of conventional circuit board substrate base 5, e.g., formed of an electrically insulating material such as glass filled epoxy.

Figure 3:
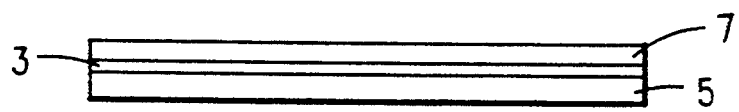

Referring also to FIG. 3, the metallized surface is then coated at a resist coating station 32 with a conventional photoresist layer 7. Both the material composition and manner of deposition of the photoresist layer should not be viewed restrictively. Rather, it is to be understood that all prior art methods of deposition and all prior art material compositions may be used without departing from the teachings of the present invention.

Figure 4:
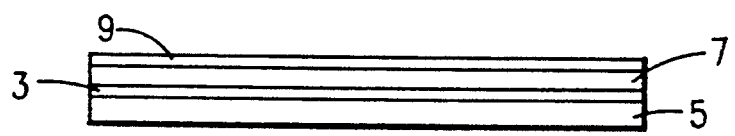

Referring also to FIG. 4, after depositing the photoresist layer 7 upon the conductive layer 3 of the circuit board substrate 5, a halide emulsion layer 9 is deposited thereon at an emulsion coating station 34. Preferably, the halide emulsion layer comprises photographic grade silver bromide; although other light sensitive silver halides may be used in the instant invention. Also, if desired, one or more light sensitizing agents may be included in the silver halide emulsion in known manner. The metal halide layer may be cast, but preferably is spin coated in order to achieve a thin, uniform coating. The metal halide emulsion layer should be made as thin as possible in order to enhance definition, since resolution and definition of the photoresist layer is essentially a function of the photodiffusion and distortion characteristics of the halide layer. Preferably, the thickness of the halide layer is 0.1 to 1.0 mil.

Figure 5:
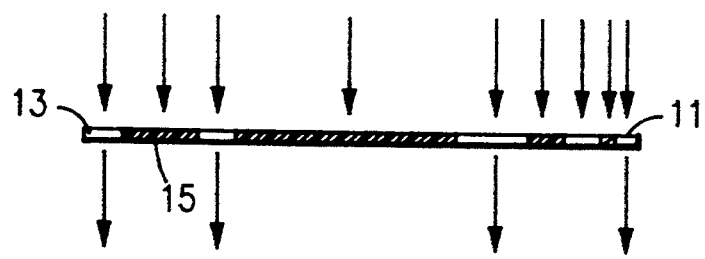
Figure 5:
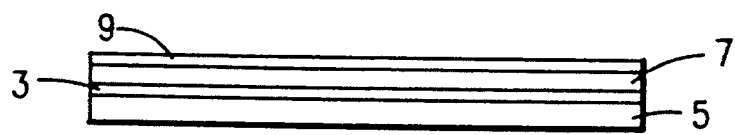

Referring also to FIG. 5, the emulsion-coated board is then passed to a first imaging station 36 where the coated board is then exposed through a mask 11 having a pattern image 11 that corresponds negatively to the desired pattern of interconnection lines to be embodied. The mask may comprise a photographic plate or other such masking device comprising both opaque regions 15 and transparent regions 13. Advantageously, a single pattern image mask may be reused to produce any number of printed circuit boards. The coated board is exposed to light of a predetermined wavelength to which the silver halide layer is sensitive, e.g. white light, but which light has little or no effect on the underlying photopolymer layer. The light is passed through transparent regions and is prevented from passing through opaque regions of the pattern image mask. Thus, only light striking transparent regions passes through the pattern image to reach the surface of the halide layer 9. The distance between the pattern image 11 and the surface of the halide layer 9 should be predetermined so as to eliminate optical dispersion and aperturic distortion that may result from placing the pattern mask at a distance that is either too close or too far away from the surface of the halide layer 9. Light that is transmitted through the pattern image 11 strikes and activates only selected areas of halide layer 9. Alternatively, the exposure may be effected by a computer driven array scanner, or raster or the like, which selectively directs light in a predetermined pattern onto the halide layer.

Figure 6:
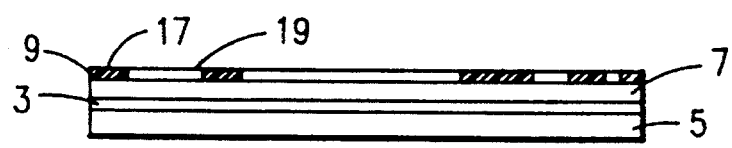

The exposed plate is then developed at development station 38 employing conventional silver halide photography development techniques which reduces the activated halide particles to black metallic silver. Halide particles which have not been activated by exposure to light can then be dissolved out of the emulsion in a conventional fixing bath, resulting in an emulsion layer having opaque 17 and transparent regions 19 portions (FIG. 6). The opaque regions 17 and transparent regions 19 of the emulsion layer 9, in turn function as a mask for the subsequent exposure of the photoresist.

Figure 7:
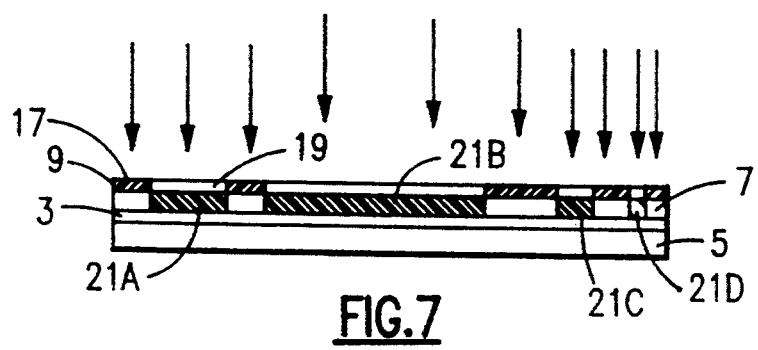

Referring also to FIG. 7, following development of the halide emulsion layer 9, a conventional UV light is shone onto the surface of the developed halide emulsion layer at a second exposure station 40. Those portions of the photoresist layer 7 that are not covered by opaque regions 17 of the emulsion layer 9 are activated by the light passing through transparent regions 19. The reaction resulting therefrom may be of a polymerization-type or other such photosensitive reaction, depending upon the type of photoresist used. The photosensitive reaction described above thus produces reacted regions 21A, 21B, 21C, and 21D as depicted in FIG. 7.

Figure 8:
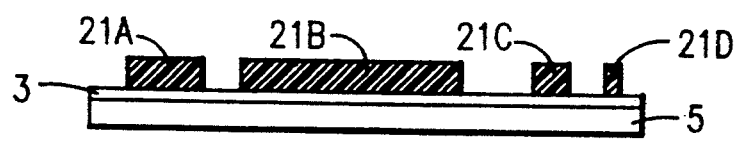
Figure 9:
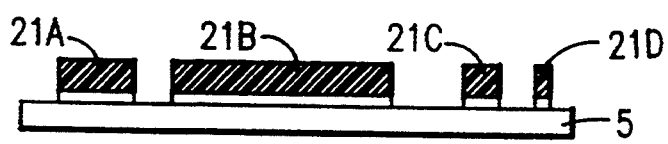
Figure 10:

Thereafter, the emulsion layer 9 and the unreacted portions of the photoresist layer 7 are removed, e.g. by peeling or stripping the emulsion layer, in a stripping station 42, and then dissolving the unreacted portions of the photoresist in a known manner, in a differential solvent for the resist in a solvent station 44 leaving a structure in which selected areas of the conductive layer 3 are exposed, e.g. as shown in FIG. 8. The resulting structure may then be passed to an etching station 46 wherein exposed areas of the conductive layer 3 are removed (as shown in FIG. 9), while areas (21E, 21F, 21G, 21H—FIG. 10) protected by the photoresist remain intact. Finally, the remaining portions of photoresist 21 are removed, in known manner at a resist removal station 48, yielding a substrate having formed therein a predetermined fine line conductive pattern.

A feature and advantage of the present invention is the ability to achieve extremely fine line definition and high resolution using conventional mass exposure techniques. This feature and advantage follows from the provision of a halide emulsion, directly on the photoresist. The halide emulsion, after exposure and development, acts as a high definition mask in direct contact with the photoresist. Thus, light scattering, etc. problems of using a conventional separate mask are eliminated. Also, due to the extreme fast exposure time, high definition and resolution achievable using silver halide emulsion, fine line definition may be achieved from a single fixed position light source. Thus, using the instant invention, it is possible to rapidly and inexpensively mass produce printed circuit boards having extremely fine line definition and high resolution, using relatively low cost conventional exposure apparatus. Moreover, exposing the silver halide layer by means of a scanning exposure system or the like facilitates accomodating for pattern errors.

Although, the foregoing preferred description of the present invention was described in connection with a subtractive process employing a metallized circuit board having only one conductive layer, the instant invention also may be used to produce multi-layer circuit boards. Also, the present invention also may be advantageously used to produce circuit boards employing additive techniques.

It is, therefore, evident that there has been provided, in accordance with the present invention, a process for forming printed circuit board interconnection lines that fully satisfies both the objects and advantages hereinbefore set forth. While this invention has been described in conjunction with specific embodiments thereof, it is evident that many alternatives, modifications, and variations will be apparent to those skilled in the art. Accordingly, it is intended to embrace all such alternatives, modifications, and variations as fall within the spirit and broad scope of the appended claims.

I claim:

1. In a process for forming interconnection lines on a circuit board substrate, wherein a circuit board substrate is covered with a photoresist layer which is exposed through a mask to UV light, the improvement which comprises the steps in sequence of:
   (a) covering said photoresist layer directly with a light sensitive emulsion layer, said emulsion layer being formed in situ from a silver halide emulsion;
   (b) exposing said emulsion layer to a predetermined pattern of light of a first wavelength to which said silver halide emulsion is sensitive;
   (c) developing said exposed emulsion layer whereby to form a mask including both substantially opaque and substantially transparent portions in direct contact with said photoresist;
   (d) exposing said masked board to light of a second wavelength to which said photoresist is sensitive whereby to expose areas of the photoresist underlying said transparent portions;
   (e) removing said exposed emulsion layer; and
   (f) processing said exposed photoresist in a conventional manner.

2. In a process according to claim 1, the improvement wherein said silver halide emulsion layer comprises a silver bromide emulsion and is formed as a thin, uniform coating.

3. In a process according to claim 1, the improvement wherein said silver halide emulsion layer is formed by spin coating.

4. In a process according to claim 1, the improvement wherein said silver halide emulsion layer is formed by casting.

5. In a process according to claim 1, the improvement wherein said silver halide emulsion layer has a thickness of 0.1 to 1.0 mil.

6. In a process according to claim 1, wherein the photoresist is coated on the circuit board substrate, the improvement wherein said interconnection lines are formed by additive processing techniques.

7. In a process according to claim 1, wherein the circuit board substrate comprises a metallized circuit board and said photoresist is coated on the metallized board, the improvement wherein said interconnection lines are formed by subtractive processing techniques.

* * * * *